United States Patent
Ohashi et al.

(10) Patent No.: US 8,674,742 B2
(45) Date of Patent: Mar. 18, 2014

(54) DRIVER CIRCUIT FOR PREVENTING OVERSHOOT AND UNDERSHOOT DUE TO PARASITIC CAPACITANCE

(75) Inventors: Atsuya Ohashi, Fussa (JP); Koji Kimura, Kokubunji (JP)

(73) Assignee: Fujitsu Semiconductor Limited, Tokyo (JP)

( * ) Notice: Subject to any disclaimer, the term of this patent is extended or adjusted under 35 U.S.C. 154(b) by 0 days.

(21) Appl. No.: 13/538,724

(22) Filed: Jun. 29, 2012

(65) Prior Publication Data
US 2013/0038372 A1     Feb. 14, 2013

(30) Foreign Application Priority Data
Aug. 11, 2011    (JP) .................................. 2011-176140

(51) Int. Cl.
*H03L 5/00*     (2006.01)
*H03K 5/08*     (2006.01)

(52) U.S. Cl.
USPC ............. 327/306; 327/309; 327/108; 326/83; 361/90

(58) Field of Classification Search
USPC ............... 327/306, 309, 318, 333, 85, 77, 74, 327/381, 382, 379, 387, 108–112; 326/82, 326/83, 21, 22, 26, 27; 361/90
See application file for complete search history.

(56) References Cited

U.S. PATENT DOCUMENTS
5,801,550 A * 9/1998 Tanaka et al. .................... 326/87

FOREIGN PATENT DOCUMENTS

| JP | 03-089624 A | 4/1991 |
|----|----|----|
| JP | 03-242020 A | 10/1991 |
| JP | 05-243958 A | 9/1993 |

* cited by examiner

*Primary Examiner* — Lincoln Donovan
*Assistant Examiner* — Thomas Skibinski
(74) *Attorney, Agent, or Firm* — Arent Fox LLP

(57) ABSTRACT

A second driver is provided in addition to a first driver outputting an output signal in accordance with a voltage of an input signal. When the output signal changes from a first voltage level to a second voltage level in accordance with a voltage change of the input signal, a control part controls the second driver to assist the signal change during a period from a change start time until the output signal exceeds a third voltage level. The control part controls the second driver to suppress the signal change during a period from the time when the output signal exceeds the third voltage level until it reaches the second voltage level.

12 Claims, 6 Drawing Sheets

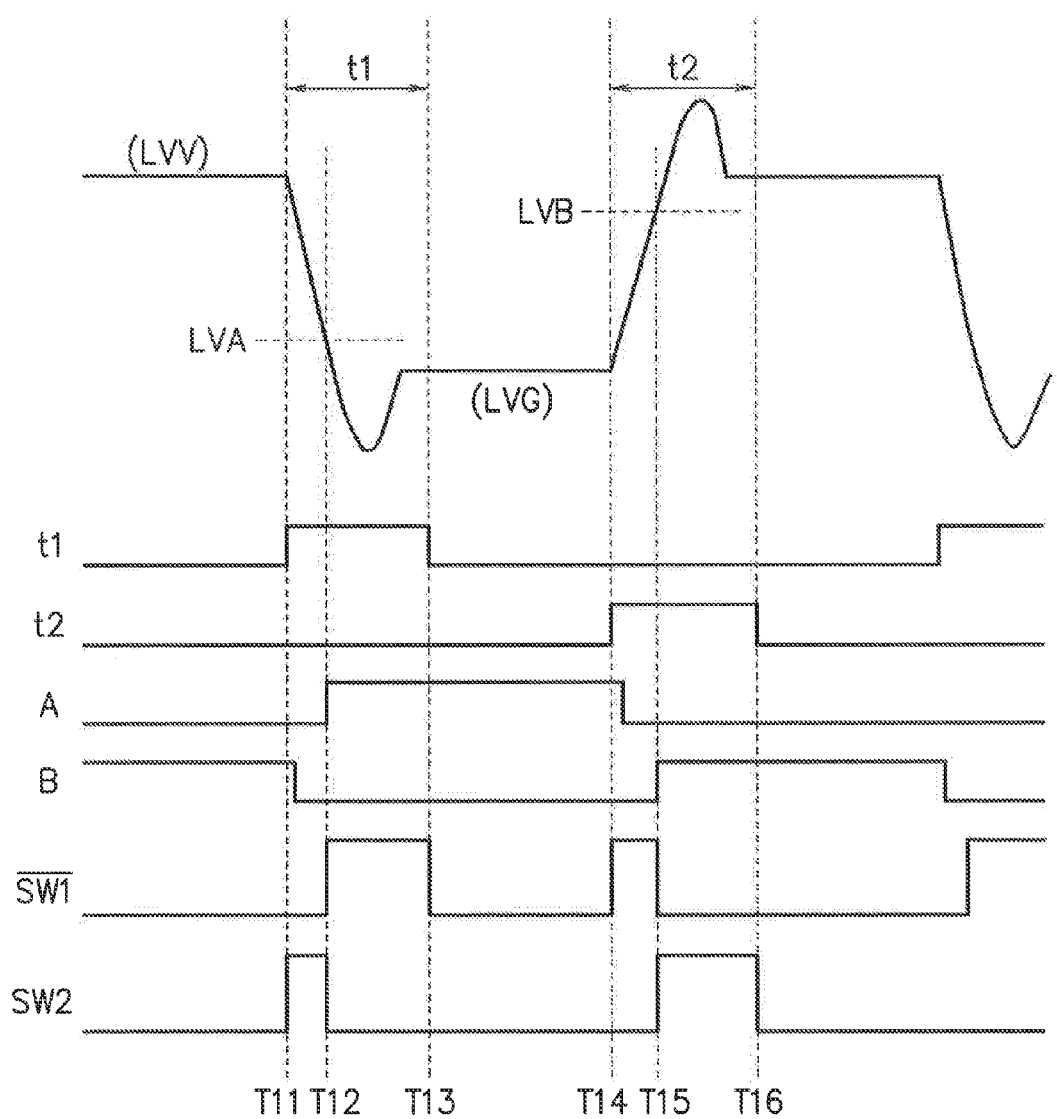

| t1 | t2 | A | B | SW1 | SW2 |
|----|----|----|----|------|------|
| 1 | 0 | 0 | 1 | OFF | ON |
| 1 | 0 | 0 | 0 | OFF | ON |
| 1 | 0 | 1 | 0 | ON | OFF |
| 0 | 1 | 1 | 0 | ON | OFF |
| 0 | 1 | 0 | 0 | ON | OFF |
| 0 | 1 | 0 | 1 | OFF | ON |
| 0 | 0 | × | × | OFF | OFF |

DRIVER CIRCUIT FOR PREVENTING OVERSHOOT AND UNDERSHOOT DUE TO PARASITIC CAPACITANCE

CROSS-REFERENCE TO RELATED APPLICATION

This application is based upon and claims the benefit of priority of the prior Japanese Patent Application No. 2011-176140, filed on Aug. 11, 2011, the entire contents of which are incorporated herein by reference.

FIELD

The embodiments discussed herein are directed to a semiconductor device, and to a control technology relating to a signal output from the semiconductor device.

BACKGROUND

In CMOS circuit in a semiconductor device, there are two states in a voltage level of a signal of a power supply voltage level as high level and a ground voltage level as low level, and the signal is transmitted at the voltage level. A change of the signal is performed by changing the voltage level of the signal from the ground voltage level to the power supply voltage level or from the power supply voltage level to the ground voltage level. However, there is a possibility that so-called an overshoot and an undershoot occur in which the signal reaches the voltage level exceeding an object power supply voltage level and ground voltage level due to a parasitic capacitance of a transmission circuit. Disorder of signal waveforms resulting from the overshoot and the undershoot causes a noise to deteriorate a transmission quality. Besides, the overshoot and the undershoot become large if high-speed is emphasized by enlarging a drive capability and so on to change the signal in high speed.

For example, a circuitry as illustrated in FIG. 8A is used to suppress the overshoot and the undershoot. FIG. 8A is a view illustrating an example of an output circuit. In FIG. 8A, a driver (output buffer) 81 is an inverter made up of, for example, CMOS transistors. The driver 81 includes a P-channel transistor 82 and an N-channel transistor 83 connected between wirings to which a power supply voltage Vdd and a ground voltage Gnd are respectively supplied. An input signal input to the output circuit is output from an output terminal out as an output signal via the driver 81.

In the output circuit illustrated in FIG. 8A, terminating resistors 84, 85 are connected to a signal line of the output signal. The terminating resistors 84, 85 are provided, and thereby, the effect caused by the parasitic capacitance of the transmission circuit is suppressed, excess of the voltage level of the signal over the power supply voltage level and the ground voltage level is suppressed, and the overshoot and the undershoot are reduced. FIG. 8B is a view illustrating waveforms of the output signal when the terminating resistors are connected as illustrated in FIG. 8A. In FIG. 8B, a signal waveform 86 illustrated by a solid line represents the output waveform when the terminating resistors are connected, and a signal waveform 87 illustrated by a dotted line represents an output waveform when the terminating resistors are not connected.

A method is proposed in which the overshoot and the undershoot are reduced by terminating operations of one driver from among two drivers outputting the output signals just before the voltage level of the signal reaches the objective power supply voltage level or ground voltage level (for example, refer to Patent Document 1). A method is proposed in which one driver is operated until the voltage level of the signal reaches a certain voltage level and two drivers are operated after the signal reaches the certain voltage level when the output signal changes (for example, refer to Patent Documents 2, 3).

[Patent Document 1] Japanese Laid-open Patent Publication No. 03-242020
[Patent Document 2] Japanese Laid-open Patent Publication No 05-243958
[Patent Document 3] Japanese Laid-open Patent Publication No. 03-89624

As stated above, the terminating resistors are connected to the signal line of the output signal, then the overshoot and the undershoot are reduced as illustrated in FIG. 8B. However, an amplitude level of the signal becomes small because the voltage level at a steady time does not reach the power supply voltage level and the ground voltage level caused by an effect of the terminating resistors. Besides, the voltage level in reverse to a signal change is applied for the signal line of the output signal from a power supply or a ground voltage (ground) connected via the terminating resistors, and thereby, a time required from a start to an end of the change of the output signal increases, and the signal change delays. Besides, the signal line is connected to the power supply and the ground voltage (ground) via the terminating resistors, and thereby, a leak current occurs constantly, and power consumption increases.

In the art described in Patent Document 1, the overshoot and the undershoot are reduced by terminating the operations of one driver. However, the overshoot and the undershoot occur due to the parasitic capacitance of the transmission circuit because the other driver continues to operate. Note that it is conceivable to reduce a voltage change amount per certain time as a method to suppress the overshoot and the undershoot, but the time required for the change of the output signal increases and the high-speed operation becomes impossible.

SUMMARY

An aspect of a semiconductor device includes: a first drive circuit outputting an output signal to an output signal line in accordance with a voltage of an input signal; a second drive circuit of which output end is connected to the output signal line; and a control part controlling the second drive circuit. When the output signal changes from the first voltage level to the second voltage level in accordance with a voltage change of the input signal, the control part controls the second drive circuit to assist a change of the output signal until a voltage level of the output signal reaches a third voltage level and to suppress the change of the output signal after the voltage level of the output signal reaches the third voltage level.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a signal waveform diagram to explain operations of the semiconductor device in the embodiment;

DESCRIPTION OF EMBODIMENTS

Hereinafter, preferred embodiments will be explained with reference to accompanying drawings.

Figure 1:
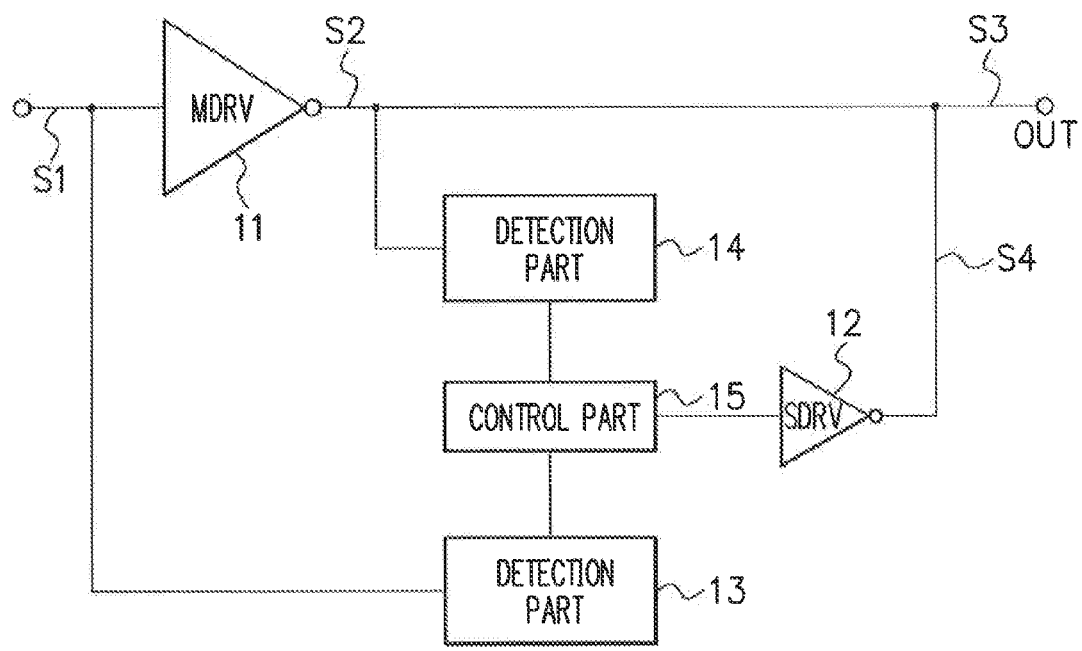
FIG. 1 is a view illustrating configuration example of a semiconductor device in an embodiment.

FIG. 1 is a view illustrating a configuration example of a semiconductor device in an embodiment. In FIG. 1, a reference numeral 11 is a main driver (output buffer), a reference numeral 12 is an auxiliary driver (auxiliary output buffer), a reference numeral 13 is a first detection part, a reference numeral 14 is a second detection part, and a reference numeral 15 is a control part.

The main driver 11 receives an input signal S1 input to an input terminal of the semiconductor device, and inverts and outputs the signal as an output signal S2. The auxiliary driver 12 is a driver of which drive capability is smaller than a drive capability of the main driver 11, and of which operations are controlled by a control signal from the control part 15. The auxiliary driver 12 outputs an output in accordance with the control signal from the control part 15 as an output signal S4. A signal in which the output signal S2 and the output signal S4 are combined corresponds to an output signal S3 output from an output terminal OUT of the semiconductor device. Note that the drive capability of the auxiliary driver 12 may be the same as the drive capability of the main driver 11.

The input signal S1 of the main driver 11 is input to the first detection part 13, and the first detection part 13 detects a change of the output signal S2 at the main driver 11 and a time required for the change based on the input signal S1. The first detection part 13 outputs a control signal to the control part 15 in accordance with a detection result. The output signal S2 of the main driver 11 is input to the second detection part 14, and the second detection part 14 detects a voltage level of the output signal S2. The second detection part 14 outputs a detection result to the control part 15 by a control signal. The output of the first detection part 13 (the control signal output from the first detection part 13) and the output of the second detection part 14 (the control signal output from the second detection part 14) are input to the control part 15. Based on these outputs (control signals), the control part 15 generates and outputs a control signal to control the operations of the auxiliary driver 12.

Figure 2:
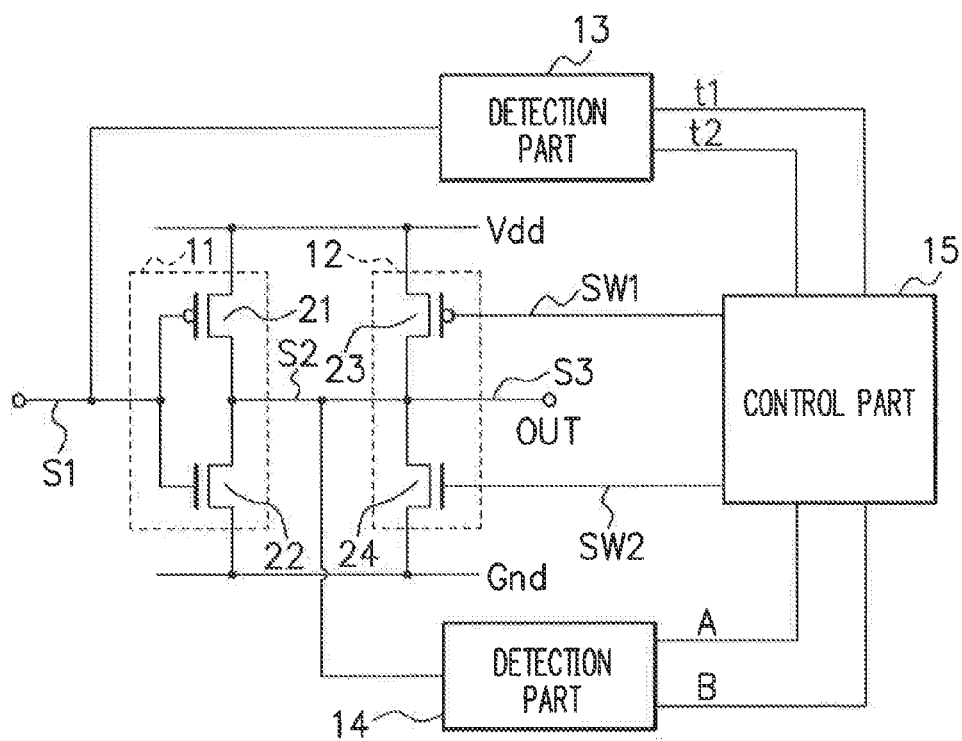
FIG. 2 is a view illustrating a configuration example of the semiconductor device in the embodiment.

FIG. 2 is a view illustrating a detailed configuration example of the semiconductor device in the embodiment. In FIG. 2, the same reference numerals and symbols are used for components having the same functions as the components illustrated in FIG. 1.

As illustrated in FIG. 2, the main driver 11 includes a P-channel type field effect transistor 21 and an N-channel type field effect transistor 22 connected between wirings to which a power supply voltage Vdd and a ground voltage Gnd are respectively supplied. In the P-channel transistor 21, the power supply voltage Vdd is supplied to a source, and a drain is connected to a drain of the N-channel transistor 22. In the N-channel transistor 22, the ground voltage Gnd is supplied to a source thereof. The input signal S1 is supplied to gates of the P-channel transistor 21 and the N-channel transistor 22. An electric potential of an interconnection point of the drains of the P-channel transistor 21 and the N-channel transistor 22 is output to a signal line of the output signal S3 as the output signal S2 of the main driver 11.

The auxiliary driver 12 includes a P-channel type field effect transistor 23 and an N-channel type field effect transistor 24 connected between wirings to which the power supply voltage Vdd and the ground voltage Gnd are respectively supplied. In the P-channel transistor 23, the power supply voltage Vdd is supplied to a source, and a drain is connected to a drain of the N-channel transistor 24. In the N-channel transistor 24, the ground voltage Gnd is supplied to a source thereof. A control signal SW1 output from the control part 15 is supplied to a gate of the P-channel transistor 23, and a control signal SW2 output from the control part 15 is supplied to a gate of the N-channel transistor 24. An interconnection point of the drains of the P-channel transistor 23 and the N-channel transistor 24 is connected to the signal line of the output signal S3.

The first detection part 13 receives the input signal S1 to the main driver 11, and outputs control signals t1, t2. The first detection part 13 detects whether a voltage level of the output signal S2 at the main driver 11 changes from the power supply voltage level to the ground voltage level (falling) or from the ground voltage level to the power supply voltage level (rising) based on the input signal S1. Besides, the first detection part 13 detects timings of a start and an end of a falling operation related to the output signal S2 or timings of a start and an end of a rising operation related to the output signal S2 by the main driver 11. The first detection part 13 asserts the control signal t1 at the falling operation time (in detail, during a period from the start of the falling operation to a stable period after the operation end) at the main driver 11 in accordance with a detection result. Besides, the first detection part 13 asserts the control signal t2 at the rising operation time (in detail, during a period from the start of the rising operation to a stable period after the operation end) at the main driver 11 in accordance with the detection result.

The second detection part 14 receives the output signal S2 of the main driver 11. The second detection part 14 detects a voltage level of the output signal S2, and outputs control signals A, B in accordance with a detected voltage level. The second detection part 14 detects whether or not the voltage level of the output signal S2 is lower than a first voltage level in a vicinity of the ground voltage level, asserts the control signal A when it is lower than the first voltage level, and otherwise, negates the control signal A. Besides, the second detection part 14 detects whether or not the voltage level of the output signal S2 is higher than a second voltage level in a vicinity of the power supply voltage level, asserts the control signal B when it is higher than the second voltage level, and otherwise, negates the control signal B.

Here, the first voltage level and the second voltage level are voltage levels between the power supply voltage Vdd and the ground voltage Gnd, and satisfy a relationship of (ground voltage Gnd)<(first voltage level)<(second voltage level)< (power supply voltage Vdd). For example, the first voltage level is an voltage level within a range of $0.05\times(Vdd-Gnd)$ to $0.20\times(Vdd-Gnd)$, the second voltage level is an voltage level within a range of $0.80\times(Vdd-Gnd)$ to $0.95\times(Vdd-Gnd)$.

The control part 15 receives the control signals t1, t2 output from the first detection part 13 and the control signals A, B output from the second detection part 14. The control part 15 outputs the control signals SW1, SW2 controlling the operations of the auxiliary driver 12 according to the control signals t1, t2 and the control signals A, B. Namely, the control part 15 outputs the control signals SW1, SW2 as illustrated in FIG. 3 based on the control signals t1, t2 and the control signals A, B to ON/OFF control the transistors 23, 24 of the auxiliary driver 12.

FIG. 3 is a signal waveform diagram to explain operations of the semiconductor device in the present embodiment. In FIG. 3, reference symbols t1, t2 are the control signals output from the first detection part 13 to the control part 15, and reference symbols A, B are the control signals output from the second detection part 14 to the control part 15. Note that the control signals t1, t2 and the control signals A, B are set at high-level when they are asserted, and set at low-level when they are negated. Reference symbols SW1, SW2 are the control signals output from the control part 15 to the auxiliary driver 12. An inversion signal of the control signal SW1 is illustrated in FIG. 3 to indicate a period when the P-channel transistor 23 and the N-channel transistor 24 of the auxiliary driver 12 are turned into ON state with correspond to the high level. A reference symbol LVV is the power supply voltage level, a reference symbol LVG is the ground voltage level, a reference symbol LVA is the first voltage level in a vicinity of the ground voltage level LVG, and a reference symbol LVB is the second voltage level in a vicinity of the power supply voltage level LVV.

At first, an initial state in FIG. 3 is state in which enough time elapses under a state in which the input signal S1 to the main driver 11 is at low-level, and the voltage level of the output signal S2 of the main driver 11 is stable at the power supply voltage level LVV. At this time, the control signals t1, t2 and the control signal A are at low-level, and the control signal B is at high-level. Besides, the control signal SW1 output from the control part 15 is at high-level and the control signal SW2 output from the control part 15 is at low-level when the control signals t1, t2 and the control signals A, B are at the above states. Accordingly, the transistors 23, 24 of the auxiliary driver 12 are both in OFF state (non-conduction state), and the auxiliary driver 12 is in OFF state.

At a time T11, the input signal S1 changes from low-level to high-level, then the main driver 11 starts the falling operation to change the voltage level of the output signal S2 from the power supply voltage level to the ground voltage level. Besides, the first detection part 13 detects the change of the input signal S1 from low-level to high-level, and sets the control signal t1 at high-level. The control part 15 receives the control signal t1 at high-level, then sets the control signal SW2 at high-level until the control signal A becomes at high-level. Namely, the control signals SW1, SW2 are set at high-level by the control part 15 and the N-channel transistor 24 of the auxiliary driver 12 is turned into ON state (conduction state) during a period when the control signal t1 is at high-level and the control signal A is at low-level.

As stated above, the auxiliary driver 12 is controlled such that the transistor at the ground voltage side is turned into ON state and the voltage is applied in a direction to decrease the voltage level to assist the change of the output signal S3 from the power supply voltage level to the ground voltage level when the falling operation is started at the main driver 11. Accordingly, the high-speed change from the power supply voltage level to the ground voltage level at the output signal S3 is improved.

At a time T12 when the voltage level of the output signal S2 of the main driver 11 becomes lower than the first voltage level LVA, the second detection part 14 detects that the voltage level of the output signal S2 becomes lower than the first voltage level LVA, and sets the control signal A at high-level. Note that the second detection part 14 detects that the voltage level of the output signal S2 is not higher than the second voltage level LVB and sets the control signal B at low-level before the voltage level of the output signal S2 becomes lower than the first voltage level LVA.

The control part 15 receives the control signal A at high-level when the control signal t1 is at high-level, then sets the control signal SW2 from high-level to low-level, and changes the N-channel transistor 24 of the auxiliary driver 12 from ON state to OFF state. Besides, the control part 15 sets the control signal SW1 at low-level until the control signal t1 becomes at low-level after (or may be simultaneously when) the control signal SW2 is set from high-level to low-level. Namely, the control signals SW1, SW2 are set at low-level by the control part 15 and the P-channel transistor 23 of the auxiliary driver 12 becomes in ON state (conduction state) when the control signal t1 is at high-level and the control signal A is at high-level.

As stated above, the auxiliary driver 12 is controlled such that the transistor at the power supply voltage side is turned into ON state and the voltage is applied in a direction to increase the voltage level when the voltage level of the output signal S2 of the main driver 11 becomes lower than the first voltage level LVA. It is thereby possible to suppress that the voltage level of the output signal S3 exceeds the ground voltage and to reduce the undershoot.

Subsequently, the first detection part 13 judges that the voltage level of the output signal S2 becomes stable and sets the control signal t1 at low-level at a time T13 when a delay time elapses after the voltage level of the output signal S2 of the main driver 11 reaches the ground voltage level LVG. The control part 15 turns the control signal SW1 from low-level to high-level and changes the P-channel transistor 23 of the auxiliary driver 12 from ON state to OFF state when the control signal t1 becomes at low-level. Namely, the control signal SW1 is set at high-level and the control signal SW2 is set at low-level by the control part 15 and the transistors 23, 24 of the auxiliary driver 12 are turned into OFF states during a period when the control signals t1, t2 are both at low-level. As stated above, the auxiliary driver 12 is controlled to be in OFF state when the falling operation at the main driver 11 finishes. It is thereby possible to suppress constant occurrence of a leak current via the auxiliary driver 12 and to reduce power consumption.

At a time T14 under a state in which the output signal is stable at the power supply voltage level LVG, the main driver 11 starts the rising operation to change the voltage level of the output signal S2 from the ground voltage level to the power supply voltage level when the input signal S1 changes from high-level to low-level. The first detection part 13 detects the change of the input signal S1 from high-level to low-level, and sets the control signal t2 at high-level. The control part 15 receives the control signal t2 at high-level, then sets the control signal SW1 at low-level until the control signal B becomes at high-level. Namely, the control signals SW1, SW2 are set at low-level by the control part 15, and the P-channel transistor 23 of the auxiliary driver 12 is turned into ON state during a period when the control signal t2 is at high-level and the control signal B is at low-level.

As stated above, the auxiliary driver 12 is controlled such that the transistor at the power supply voltage side is turned into ON state and the voltage is applied in a direction to increase the voltage level, to assist the change of the output signal S3 from the ground voltage level to the power supply voltage level when the rising operation is started at the main driver 11. Accordingly, the high-speed change from the ground voltage level to the power supply voltage level at the output signal S3 is improved.

At a time T15 when the voltage level of the output signal S2 of the main driver 11 becomes higher than the second voltage level LVB, the second detection part 14 detects that the voltage level of the output signal S2 becomes higher than the second voltage level LVB, and sets the control signal B at high-level. Note that the second detection part 14 detects that the voltage level of the output signal S2 is not lower than the first voltage level LVA and sets the control signal A at low-level before the voltage level of the output signal S2 becomes higher than the second voltage level LVB.

The control part 15 receives the control signal B at high-level when the control signal t2 is at high-level, then sets the control signal SW1 from low-level to high-level, and sets the P-channel transistor 23 of the auxiliary driver 12 in OFF state. Besides, the control part 15 sets the control signal SW2 at high-level until the control signal t2 becomes at low-level after (or may be simultaneously when) the control signal SW1 is set from low-level to high-level. Namely, the control signals SW1, SW2 are set at high-level by the control part 15 and the N-channel transistor 24 of the auxiliary driver 12 is turned into ON state during a period when the control signal t2 is at high-level and the control signal B is at high-level.

As stated above, the auxiliary driver 12 is controlled such that the transistor at the ground voltage side is turned into ON state and the voltage is applied in a direction to decrease the voltage level when the voltage level of the output signal S2 of the main driver 11 becomes higher than the second voltage level LVB. It is thereby possible to suppress that the voltage level of the output signal S3 exceeds the power supply voltage, and to reduce the overshoot.

Subsequently, the first detection part 13 judges that the voltage level of the output signal S2 is stable and sets the control signal t2 at low-level at a time T16 when a delay time elapses after the voltage level of the output signal S2 of the main driver 11 reaches the power supply voltage level LVV. The control part 15 turns the control signal SW2 from high-level to low-level and changes the N-channel transistor 24 of the auxiliary driver 12 from ON state to OFF state when the control signal t2 becomes at low-level. As stated above, the auxiliary driver 12 is controlled to be in OFF state when the rising operation at the main driver 11 finishes, and it is possible to suppress the constant occurrence of the leak current via the auxiliary driver 12, and to reduce the power consumption.

Note that the delay times to turn the auxiliary driver 12 into OFF state after the voltage level of the output signal S2 reaches the power supply voltage level LVV or the ground voltage level LVG are set in advance in accordance with, for example, the main driver 11 to be used.

Figure 7:
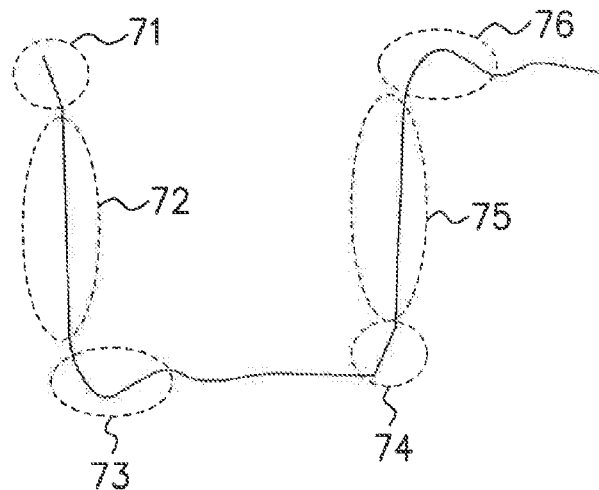
FIG. 7 is a view illustrating an example of an output waveform of the semiconductor device in the embodiment.
Figure 8A:
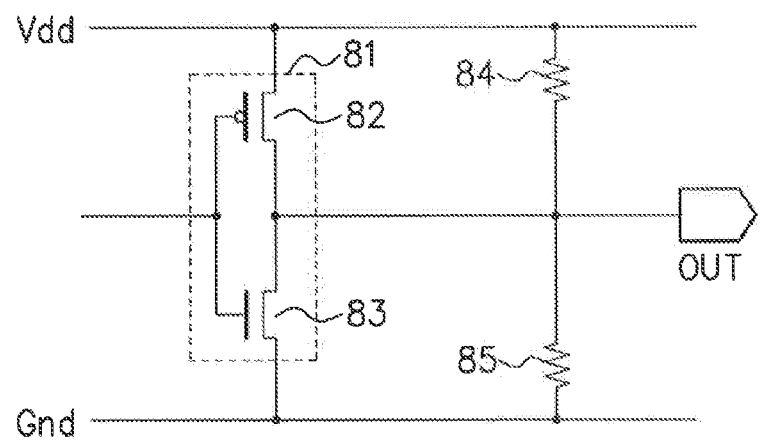
FIG. 8A is a view illustrating an example of an output circuit.
Figure 8B:
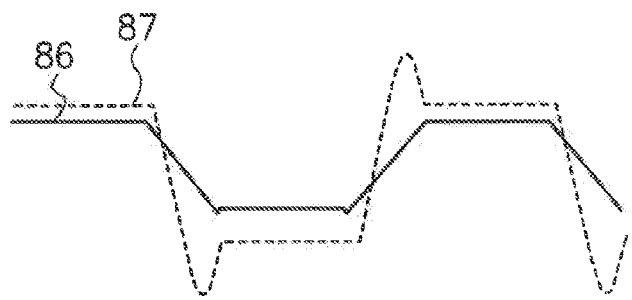
FIG. 8B is a view illustrating an output waveform of the output circuit.

As stated above, the auxiliary driver 12 is controlled in accordance with the state of the main driver 11 (output signal S2), and thereby, the waveform of the output signal S3 output from the output terminal OUT of the semiconductor device is improved as an example is illustrated in FIG. 7. In the signal waveform illustrated in FIG. 7, the waveform is illustrated when only the main driver 11 operates and the auxiliary driver 12 is in OFF state at portions indicated by reference numerals 71, 74. Besides, portions indicated by reference numerals 72, 75 are the periods when the auxiliary driver 12 is controlled such that the voltage in the same direction is applied to the output signal relative to the direction in which the main driver 11 tries to change the voltage level of the output signal. During this period, the output signal is driven by the two drives of the main driver 11 and the auxiliary driver 12, and therefore, it is possible to enable the rapid signal change and to improve the high-speed because the signal change of the output signal S3 is accelerated. Besides, portions indicated by reference numerals 73, 76 are periods when the auxiliary driver 12 is controlled such that the voltage in a reverse direction is applied to the output signal relative to the direction in which the main driver 11 tries to change the voltage level of the output signal. During this period, the auxiliary driver 12 operates to suppress the change of the output signal by the main driver 11, and thereby, it is possible to reduce the signal change of the output signal S3 and to reduce the overshoot and the undershoot.

Hereinafter, respective configuration examples of the first detection part 13, the second detection part 14, and the control part 15 included by the semiconductor device in the present embodiment are described. Note that the configurations represented in the following are examples and they are not limited thereto.

Figure 4A:
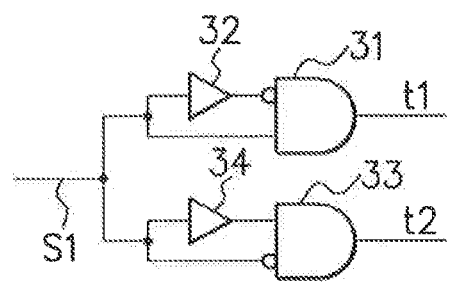
FIG. 4A and FIG. 4B are views illustrating configuration examples of a first detection part in the embodiment.

FIG. 4A is a view illustrating a first configuration example of the first detection part 13. The first detection part 13 illustrated in FIG. 4A includes logical product operation circuits (AND circuits) 31, 33, and delay circuits 32, 34.

The input signal S1 is input to a first input end, and the input signal S1 delayed for a certain time by the delay circuit 32 is inverted and input to a second input end, in the two-input AND circuit 31. Note that a signal delayed by the delay circuit 32 after the input signal S1 is inverted may be input to the second input end of the AND circuit 31. An output of the two-input AND circuit 31 is output as the control signal t1. Besides, the input signal S1 is inverted and input to a first input end, and the input signal S1 delayed for a certain time by the delay circuit 34 is input to a second input end, in the two-input AND circuit 33. An output of the two-input AND circuit 33 is output as the control signal t2.

In the first detection part 13 illustrated in FIG. 4A, the control signal t1 is at high-level from a start time of the change of the input signal S1 until the delay time by the delay circuit 32 elapses when the input signal S1 changes from low-level to high-level (when the output signal S2 is falling). The control signal t2 is at high-level from the start time of the change of the input signal S1 until the delay time by the delay circuit 34 elapses when the input signal S1 changes from high-level to low-level (when the output signal S2 is rising). In the first detection part 13 illustrated in FIG. 4A, the delay circuits 32, 34 having the delay times in accordance with, for example, the main driver 11 to be used are used, and thereby, it is possible to generate the control signals t1, t2 enabling the operations illustrated in FIG. 3.

Figure 4B:
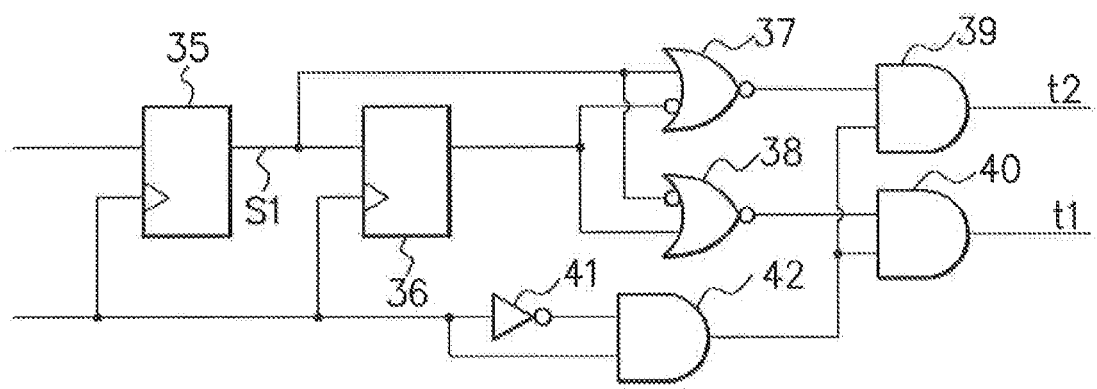

FIG. 4B is a view illustrating a second configuration example of the first detection part 13. The first detection part 13 illustrated in FIG. 4B includes flip-flops 35, 36, negative logical sum operation circuits (NOR circuits) 37, 38, AND circuits 39, 40, 42, and an inverter (delay circuit) 41.

The flip-flops 35, 36 operate by the same clock signal, and an output of the flip-flop 35 is input to an input end of the flip-flop 36. The output of the flip-flop 35 corresponds to the input signal S1 to the main driver 11. The output of the flip-flop 35 is input to a first input end, and an output of the flip-flop 36 is inverted and input to a second input end in the two-input NOR circuit 37. The output of the flip-flop 35 is inverted and input to a first input end, and the output of the flip-flop 36 is input to a second input end in the two-input NOR circuit 38.

An output of the NOR circuit 37 is input to a first input end, and an output of the AND circuit 42 is input to a second input end in the two-input AND circuit 39. An output of the NOR circuit 38 is input to a first input end, and the output of the AND circuit 42 is input to a second input end in the two-input AND circuit 40. The clock signal used for the operations of the flip-flops 35, 36 is input to the inverter 41. An output of the inverter 41 is input to a first input end, and the clock signal used for the operations of the flip-flops 35, 36 is input to a second input end in the two-input AND circuit 42. An output of the two-input AND circuit 39 is output as the control signal t2, and an output of the two-input AND circuit 40 is output as the control signal t1.

Figure 5A:
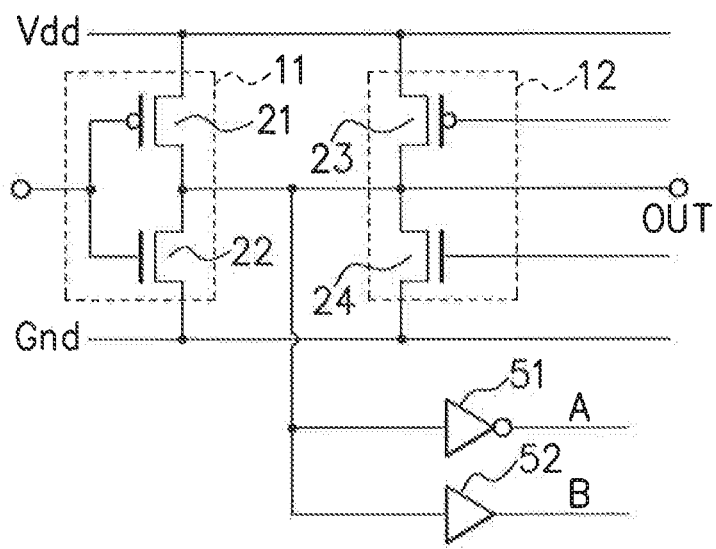
FIG. 5A and FIG. 5B are views illustrating configuration examples of a second detection part in the embodiment.

FIG. 5A is a view illustrating a first configuration example of the second detection part 14. In FIG. 5A, the same reference numerals and symbols are used for the same components as the components illustrated in FIG. 2. The second detection part 14 illustrated in FIG. 5A includes an inverter 51 and a buffer 52.

An input end of the inverter 51 is connected to the output end of the main driver 11. An output of the inverter 51 is output as the control signal A. A threshold value (Vth) of the inverter 51 is the first voltage level LVA in a vicinity of the ground voltage level LVG. Accordingly, the output of the inverter 51 output as the control signal A becomes at high-level when an electric potential of the output end of the main driver 11 is lower than the first voltage level LVA, and otherwise, becomes at low-level.

An input end of the buffer 52 is connected to the output end of the main driver 11. An output of the buffer 52 is output as the control signal B. A threshold value (Vth) of the buffer 52 is the second voltage level LVB in a vicinity of the power supply voltage level LVV. Accordingly, the output of the buffer 52 output as the control signal B becomes at high-level when the electric potential of the output end of the main driver 11 is higher than the second voltage level LVB, and otherwise, becomes at low-level.

Figure 5B:
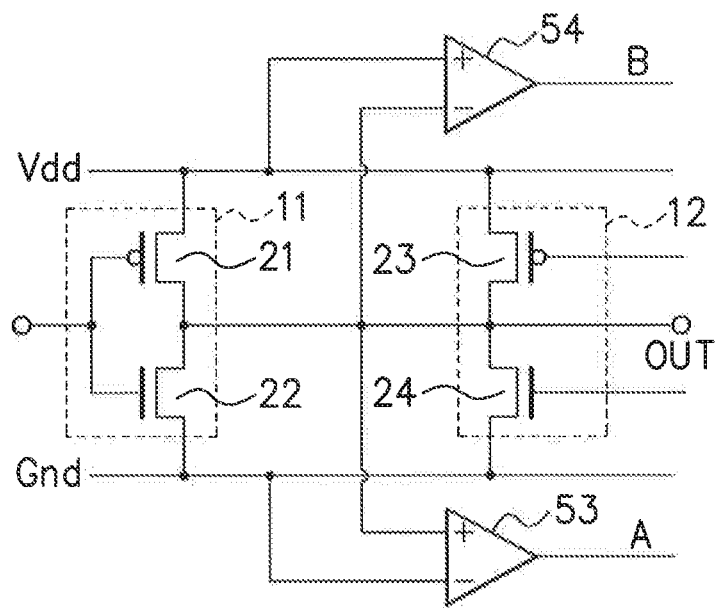

FIG. 5B is a view illustrating a second configuration example of the second detection part 14. In FIG. 5B, the same reference numerals and symbols are used for the same components as the components illustrated in FIG. 2. The second detection part 14 illustrated in FIG. 5B includes comparators 53, 54. The comparator 53 judges whether or not the supplied electric potential of the output end of the main driver 11 is lower than the first voltage level LVA, and outputs a judgment result as the control signal A. The comparator 54 judges whether or not the supplied electric potential of the output end of the main driver 11 is higher than the second voltage level LVB, and outputs a judgment result as the control signal B.

Figures 6A, 6B:
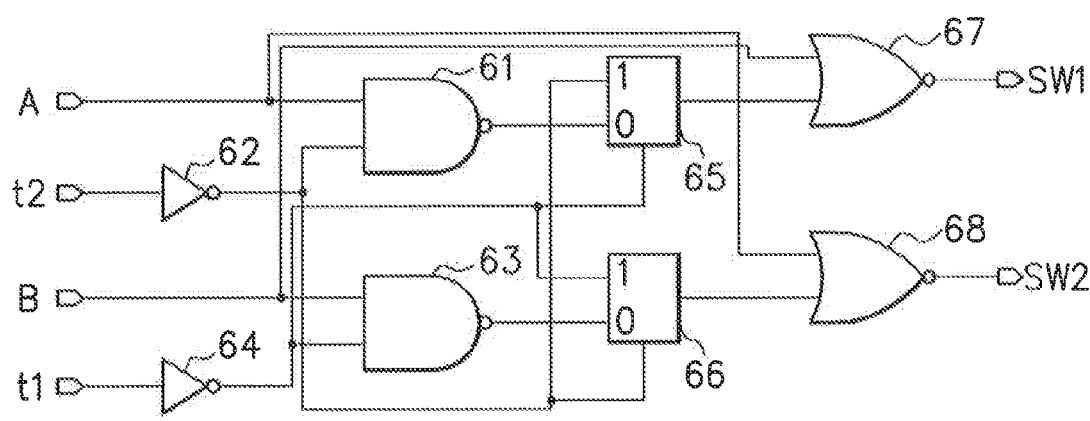
FIG. 6A is a view illustrating a configuration example of a control part in the embodiment.
FIG. 6B is a view illustrating an operation logic of the control part in the embodiment.

FIG. 6A is a view illustrating a configuration example of the control part 15. The control part 15 illustrated in FIG. 6A includes negative logical product operation circuits (NAND circuits) 61, 63, inverters 62, 64, selectors 65, 66, and NOR circuits 67, 68.

The control signal A is input and the control signal t2 is input via the inverter 62 to the two-input NAND circuit 61, and the NAND circuit 61 outputs a result of the operation. The control signal B is input and the control signal t1 is input via the inverter 64 to the two-input NAND circuit 63, and the NAND circuit 63 outputs a result of the operation. The control signal t2 is input via the inverter 62, and an output of the NAND circuit 61 is input to the selector 65. Besides, the control signal t1 is input to the selector 65 via the inverter 64 as a selection signal. The selector 65 outputs the control signal t2 input via the inverter 62 when the selection signal is "1" (control signal t1 is "0" (zero)), and outputs the output of the NAND circuit 61 when the selection signal is "0" (zero) (control signal t1 is "1"). The control signal t1 is input via the inverter 64, and an output of the NAND circuit 63 is input to the selector 66. Besides, the control signal t2 is input to the selector 66 via the inverter 62 as a selection signal. The selector 66 outputs the control signal t1 input via the inverter 64 when the selection signal is "1" (control signal t2 is "0" (zero)), and outputs the output of the NAND circuit 63 when the selection signal is "0" (zero) (control signal t2 is "1").

The control signal B and an output of the selector 65 are input to the two-input NOR circuit 67, and the NOR circuit 67 outputs a result of the operation as the signal SW1. The control signal A and an output of the selector 66 are input to the two-input NOR circuit 68, and the NOR circuit 68 outputs a result of the operation as the signal SW2. Here, the signals SW1, SW2 are "0" (zero) when it is indicated as OFF, and are "1" when it is indicated as ON in an operation logic (truth table) illustrated in FIG. 6B The control part 15 illustrated in FIG. 6A outputs the output signals in accordance with the input signals according to the operation logic (truth table) illustrated in FIG. 6B. The input signals are the control signals t1, t2, A, B, and the output signals are the control signals SW1, SW2. In FIG. 68, fields of t1, t2 indicate values of the control signals t1, t2 output from the first detection part 13, and fields of A, B indicate values of the control signals A, B output from the second detection part 14. A field of SW1 indicates a state of the P-channel transistor 23 controlled by the control signal SW1, and a field of SW2 indicates a state of the N-channel transistor 24 controlled by the control signal SW2. Namely, "ON" represents that the transistor is in ON state (conduction state), and "OFF" represents that the transistor is in OFF state (non-conduction state). In FIG. 6B, "X" represents that it is arbitrary (Don't care).

As illustrated in FIG. 6B, the control part 15 outputs the control signals SW1, SW2 so that the power supply voltage side transistor is in OFF state and the ground voltage side transistor is in ON state at the auxiliary driver 12 when the control signal t1 is "1" (high-level) and the control signals t2, A are "0" (zero) (low-level) (corresponding to the time T11 to the time T12 in FIG. 3). The control part 15 outputs the control signals SW1, SW2 so that the power supply voltage side transistor is in ON state and the ground voltage side transistor is in OFF state at the auxiliary driver 12 when the control signals t1, A are "1" and the control signals t2, B are "0" (zero) (corresponding to the time T12 to the time T13 in FIG. 3).

Besides, the control part 15 outputs the control signals SW1, SW2 so that the power supply voltage side transistor is in ON state and the ground voltage side transistor is in OFF state at the auxiliary driver 12 when the control signals t1, B are "0" (zero) and the control signal t2 is "1" (corresponding to the time T14 to the time T15 in FIG. 3). The control part 15 outputs the control signals SW1, SW2 so that the power supply voltage side transistor is in OFF state and the ground voltage side transistor is in ON state at the auxiliary driver 12 when the control signals t1, A are "0" (zero) and the control signals t2, B are "1" (corresponding to the time T15 to the time T16 in FIG. 3).

Besides, the control part 15 outputs the control signals SW1, SW2 so that both of the power supply voltage side transistor and the ground voltage side transistor are in OFF state at the auxiliary driver 12 when the control signals t1, t2 are "0" (zero) (corresponding to the time T13 to the time T14 in FIG. 3).

Note that the configuration of the control part 15 illustrated in FIG. 6A is an example, and it is not limited thereto. The control part 15 may be the one capable of outputting the output signal in accordance with the input signal according to the operation logic (truth table) illustrated in FIG. 6B, and a circuitry and so on are arbitrary.

It is possible to improve high-speed signal change in an output signal and to suppress the overshoot and the undershoot because the second drive circuit is controlled such that the change of the output signal is assisted until the voltage level of the output signal reaches the third voltage level, and thereafter, the change of the output signal is suppressed when the output signal changes from the first voltage level to the second voltage level in accordance with the voltage change of the input signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A driver circuit, comprising:
a first drive circuit that outputs an output signal to an output signal line in accordance with a voltage of an input signal;
a second drive circuit with an output end that is connected to the output signal line;
a first detection part that detects a voltage change of the input signal, and that detects whether a voltage level of the output signal changes from a high-level to a low-level or from the low-level to the high-level;
a second detection part that detects whether or not the voltage level of the output signal reaches a third voltage level set between a first voltage level and a second voltage level; and
a control part that controls the second drive circuit based on detection results at the first detection part and the second detection part,
wherein the control part controls the second drive circuit to assist a change of the output signal from the first voltage level to the second voltage level until the voltage level of the output signal reaches the third voltage level, and to suppress the change of the output signal from the first voltage level to the second voltage level after the voltage level of the output signal reaches the third voltage level when the output signal changes from the first voltage level to the second voltage level in accordance with the voltage change of the input signal.

2. The driver circuit according to claim 1,
wherein the control part makes the second drive circuit supply a first voltage changing toward the second voltage level to the output signal line until the voltage level of the output signal reaches the third voltage level, and supplies a second voltage changing toward the first voltage level to the output signal line during a period starting when the voltage level of the output signal reaches the third voltage level and ending when the voltage level becomes the second voltage level.

3. The driver circuit according to claim 1,
wherein the control part terminates operations of the second drive circuit after the output signal changes from the first voltage level to the second voltage level.

4. The driver circuit according to claim 1,
wherein the third voltage level is a voltage level just before reaching the second voltage level.

5. The driver circuit according to claim 1,
wherein the first voltage level is a ground voltage level, the second voltage level is a power supply voltage level, and the third voltage level is a voltage level between 0.80× (the power supply voltage level−the ground voltage level) to 0.95×(the power supply voltage level−the ground voltage level).

6. The driver circuit according to claim 1,
wherein the first voltage level is a power supply voltage level, the second voltage level is a ground voltage level, and the third voltage level is a voltage level between 0.05×(the power supply voltage level−the ground voltage level) to 0.20×(the power supply voltage level−the ground voltage level).

7. The driver circuit according to claim 1,
wherein the driver circuit operates while setting the first voltage level as a ground voltage level, the second voltage level as a power supply voltage level, and the third voltage level as a fourth voltage level in a first vicinity of the power supply voltage level when the output signal changes from the ground voltage level to the power supply voltage level in accordance with the voltage change of the input signal, and
wherein the driver circuit operates while setting the first voltage level as the power supply voltage level, the second voltage level as the ground voltage level, and the third voltage level as a fifth voltage level in a second vicinity of the ground voltage level when the output signal changes from the power supply voltage level to the ground voltage level in accordance with the voltage change of the input signal.

8. The driver circuit according to claim 1,
wherein the control part outputs a first control signal to the second drive circuit until the voltage level of the output signal reaches the third voltage level, and outputs a second control signal different from the first control signal to the second drive circuit after the voltage level of the output signal reaches the third voltage level.

9. A driver circuit, comprising:
a drive circuit that outputs an output signal to an output signal line in accordance with a voltage of an input signal;
a first transistor in which a first voltage at a first voltage level is supplied to a first source, and a first drain is connected to the output signal line;
a second transistor in which a second voltage at a second voltage level is supplied to a second source, and a second drain is connected to the output signal line;
a control part that sets the first transistor in an OFF state and the second transistor in an ON state until a voltage level of the output signal reaches a third voltage level set between the first voltage level and the second voltage level, and that sets the first transistor in the ON state and the second transistor in the OFF state after the voltage level of the output signal reaches the third voltage level when the output signal changes from the first voltage level to the second voltage level in accordance with a voltage change of the input signal;
a first detection part that detects the voltage change of the input signal and that outputs a first control signal in accordance with a detection result to the control part; and
a second detection part that detects whether or not the voltage level of the output signal exceeds the third voltage level and that outputs a second control signal in accordance with a detection result to the control part, wherein the control part controls the first transistor and the second transistor based on the first control signal and the second control signal.

10. The driver circuit according to claim 9,
wherein the control part sets both of the first transistor and the second transistor in the OFF state after the output signal changes from the first voltage level to the second voltage level.

11. The driver circuit according to claim 9,
wherein the first detection part asserts the first control signal when the voltage change of the input signal is detected, and negates the first control signal after the output signal changes to the second voltage level,
wherein the second detection part asserts the second control signal when the voltage level of the output signal is between the second voltage level and the third voltage level, and negates the second control signal when the voltage level of the output signal is between the first voltage level and the third voltage level,
wherein the control part sets the first transistor in the OFF state and the second transistor in the ON state during a first period when the first control signal is asserted and the second control signal is negated, and sets the first transistor in the ON state and the second transistor in the OFF state during a second period when the first control signal is asserted and the second control signal is asserted.

12. The driver circuit according to claim 9,
wherein the driver circuit operates while setting the first voltage level as the ground voltage level, the second voltage level as the power supply voltage level, and the third voltage level as a fourth voltage level in a first vicinity of the power supply voltage level when the output signal changes from the ground voltage level to the power supply voltage level in accordance with the voltage change of the input signal, and
wherein the driver circuit operates while setting the first voltage level as the power supply voltage level, the second voltage level as the ground voltage level, and the third voltage level as a fifth voltage level in a second vicinity of the ground voltage level when the output signal changes from the power supply voltage level to the ground voltage level in accordance with the voltage change of the input signal.

* * * * *

UNITED STATES PATENT AND TRADEMARK OFFICE
CERTIFICATE OF CORRECTION

| | |
|---|---|
| PATENT NO. | : 8,674,742 B2 |
| APPLICATION NO. | : 13/538724 |
| DATED | : March 18, 2014 |
| INVENTOR(S) | : Atsuya Ohashi |

Page 1 of 1

It is certified that error appears in the above-identified patent and that said Letters Patent is hereby corrected as shown below:

Title Page, item [73] should read as

(73) Assignee: Fujitsu Semiconductor Limited, Yokohama (JP)

Signed and Sealed this
Twenty-first Day of October, 2014

Michelle K. Lee
*Deputy Director of the United States Patent and Trademark Office*